(12) United States Patent
Kim et al.

(10) Patent No.: US 8,135,104 B2
(45) Date of Patent: Mar. 13, 2012

(54) SERIAL TRANSCEIVER AND COMMUNICATION METHOD USED BY THE SERIAL TRANSCEIVER

(75) Inventors: Chulwoo Kim, Seoul (KR); Inhwa Jung, Seoul (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 802 days.

(21) Appl. No.: 12/178,347

(22) Filed: Jul. 23, 2008

(65) Prior Publication Data

US 2009/0028281 A1    Jan. 29, 2009

(30) Foreign Application Priority Data

Jul. 24, 2007   (KR) .................. 10-2007-0073815

(51) Int. Cl.
*H03D 3/24* (2006.01)
(52) U.S. Cl. ........ 375/374; 375/327; 375/355; 375/356; 375/357; 375/360; 375/362; 375/363; 375/364; 375/371; 375/373; 375/375; 375/376; 375/354

(58) Field of Classification Search ............... 375/257, 375/374, 327, 354, 355, 356, 357, 360, 362, 375/363, 364, 371, 373, 375, 376; 327/41, 327/141, 144, 147, 148, 151, 156, 157; 331/11, 331/16; 455/260
See application file for complete search history.

(56) References Cited

U.S. PATENT DOCUMENTS 6,310,521 B1 * 10/2001 Dalmia .................... 331/11
7,184,512 B2 * 2/2007 Takeshita et al. ........... 375/375
* cited by examiner

*Primary Examiner* — Dhaval Patel
(74) *Attorney, Agent, or Firm* — Rabin & Berdo, P.C.

(57) ABSTRACT

A high speed transceiver without using an external clock signal and a communication method used by the high speed transceiver which applies a clock recovery circuit including a coarse code generator, a frequency detector, and a linear phase detector to the receiver so as to solve problems such as skew between a reference clock and data that may occur during data transmission and jitter of a recovered clock while an embedded clock method of applying clock information to data is used.

8 Claims, 8 Drawing Sheets

SERIAL TRANSCEIVER AND COMMUNICATION METHOD USED BY THE SERIAL TRANSCEIVER

BACKGROUND OF THE INVENTION

1. Field of the Invention

The present invention relates to a serial transceiver, and more particularly, to a high speed transceiver without using an external clock signal and a communication method used by the high speed transceiver.

2. Description of the Related Art

As various communication methods have been developed and widely used, the demand of users for multimedia increases. Accordingly, studies for transmitting a larger amount of data at a higher speed more stably and minimizing a hardware configuration needed for the transmission have been made.

In general, in order to increase a data rate, one is selected from among a parallel transmission method of increasing the number of channels and simultaneously transmitting a number of pieces of data and a serial transmission method of transmitting data at a high speed through a single channel, to maximize the functions. Here, the parallel transmission method has problems in that data skew which means time differences between data transmitted through difference channels may exist between the various transmission channels, and as the number of channels increases, hardware costs increase. Therefore, the serial data transmission method is employed as a standard for a high speed transceiver and has been widely used. Moreover, studies for configuring high speed serial communications in parallel have been carried out. Since a rate of data transceived in the serial data transceiver is very high, data uncertainty increases due to noise and channel bandwidths. In order to reduce the data transmission uncertainty, the receiver has to recover a clock to have a smaller amount of jitter to perform sampling on input data and has to maintain a phase relationship between the recovered clock and the input data at an optimal state so that a bit error ratio (BER) is minimized. Therefore, in the high speed serial communications, a role of a clock recovery circuit for re-arranging clock signals in an optimal state to enable the receiver to receive a clock and data from the transmitter and perform sampling on the input data, is very important.

A general high speed data transceiver is constructed to simultaneously transmit a reference clock signal for providing a synchronization reference for high speed transception data in order to transmit data from the transmitter to the receiver. However, in this method, in a case where data has to be transmitted for a long distance ranging several meters, due to skew between the data and the reference clock, the receiver may have problems in recovering data. In addition, in order to change the transmission speed, the conventional transceiver has to change a reference clock signal of the receiver according to the transmission speed. In addition, in order to control the operation speed of the receiver, the transceiver has to change a digital code.

In order to solve the aforementioned problems, U.S. Pat. No. 6,680,970 discloses statistical methods and systems for data rate detection for multi-speed embedded clock serial receivers to detect an edge of data. However, in this case, due to limitations of data edge detection, jitter of a recovered clock signal is higher than in a case of using a linear phase detector. Therefore, speed limitations occur, and error possibility increases.

For another method, U.S. Pat. No. 5,838,749 discloses a method and apparatus for extracting an embedded clock from a digital data signal. In this method and apparatus, a scheme for loading a clock supplier on a clock recovery circuit is used in order to solve the aforementioned problems. However, due to the loaded clock supplier, there are problems in that areas, costs, and power are increased.

SUMMARY OF THE INVENTION

<Technical Problem>

The present invention provides a serial transceiver and a communication method used by the serial transceiver which applies a clock recovery circuit including a coarse code generator, a frequency detector, and a linear phase detector to the receiver so as to solve problems such as skew between a reference clock and data that may occur during data transmission and jitter of a recovered clock while an embedded clock method of applying clock information to data is used.

The present invention also provides a serial transceiver and a communication method used by the serial transceiver which do not transmit a reference clock while transmits data so as to solve a problem of skew between the data and the reference clock and reduce the number of transmission channels and hardware costs.

The present invention also provides a serial transceiver and a communication method used by the serial transceiver which can control a speed without an additional external operation so as not to allow data to be transmitted along with a reference clock and applies a linear phase detection method to significantly decrease jitter of a recovered clock signal.

The present invention also provides a serial transceiver and a communication method used by the serial transceiver which can recover a clock signal without an additional circuit such as a clock supplier.

The present invention also provides a serial transceiver and a communication method used by the serial transceiver which applies a frequency detector for controlling an operation frequency of a voltage controlled oscillator by comparing an output of the voltage controlled oscillator with data delayed by dividing the output by a data rate to a clock recovery unit so as to generate an accurate lock signal.

The present invention also provides a serial transceiver and a communication method used by the serial transceiver which applies a linear phase detector for detecting a case of having a rising edge of serial data and controlling a charge pump by using a pulse according to a phase difference between a clock signal and the serial data signal to a clock recovery unit.

<Technical Solution>

According to an aspect of the present invention, there is provided a serial transceiver including: a transmitter which receives parallel data to be transmitted to encode the received parallel data as transmission data including direct current (DC) balancing information and includes a serial transmission unit for performing serial transmission on data encoded according to a communication clock of an internal phase locked loop (PLL) operating based on an externally provided clock; and a receiver which includes a clock recovery unit including a frequency detector and a linear phase detector for receiving the encoded data from the transmitter and performing sequential synchronization by using the received encoded data and an output of an internal voltage controlled oscillator, a parallelizer for converting the received serial data into parallel data by using clocks of a plurality of stages output from the clock recovery unit, a start bit detector for detecting a start bit by comparing data in the output of the parallelizer through a logic circuit, and a decoder for decoding and outputting the output of the parallelizer.

In the above aspect of the present invention, the transmitter may include an encoding unit which receives a plurality of parallel data signals to divide a corresponding parallel data signal into two or more units, inserts information for DC balancing into the divided position, and inserts start information and end information into start and end portions of the entire data.

In addition, the clock recovery unit of the receiver may include: the voltage controlled oscillator of a plurality of states in which a frequency range is determined by a coarse code; an internal coarse code generator receiving an output of the voltage controlled oscillator and the received serial data as inputs to provide the coarse code for controlling the voltage controlled oscillator to the voltage controlled oscillator; a frequency detector receiving a voltage controlled oscillator output in the frequency range determined by the output of the coarse code generator and the received parallel data as inputs to output a signal for controlling a voltage applied to the voltage controlled oscillator for frequency synchronization; the linear phase detector receiving the voltage controlled oscillator output and the received parallel data as inputs in a case where the frequency synchronization is performed by the frequency detector to output a signal for controlling the voltage applied to the voltage controlled oscillator for phase synchronization; and a charge pump selectively receiving the output from the frequency detector and the linear phase detector to control the voltage applied to the voltage controlled oscillator.

In addition, the clock recovery unit may further include: a sampler for sampling the received serial data by using the output of the voltage controlled oscillator; and an initiation circuit unit for generating and providing a coarse enable signal for determining whether or not the coarse code generator is to operate according to the output of the sampler to the coarse code generator.

According to another aspect of the present invention, there is provided a serial transmitter connected to a serial receiver to transmit parallel data as serial data, including: an encoding unit receiving the parallel data to be transmitted and encoding the received parallel data as transmission data including DC balancing information and start and end information; a serializer using an output clock of an internal PLL according to an externally provided clock as a communication clock to provide synchronization signals in a serial communication manner; and a serial transmission unit for performing serial transmission on data encoded according to the communication clock.

According to another aspect of the present invention, there is provided a serial receiver which is connected to a transmitter that encodes and transmits parallel data as serial data, in order to receive the serial data, recovers a clock included in the serial data, and converts and decodes the serial data into parallel data to output the received clock and the decoded parallel data, the serial receiver including: a clock recovery unit including a frequency detector and a linear phase detector for receiving the serial data from the transmitter and performing sequential synchronization by using the received serial data and an output of an internal voltage controlled oscillator; a parallelizer for converting the received serial data into parallel data by using clocks of a plurality of stages output from the clock recovery unit; a start bit detector for detecting a start bit by comparing data in the output of the parallelizer through a logic circuit; and a decoder for decoding and outputting the output of the parallelizer.

According to another aspect of the present invention, there is provided a serial receiver including a clock recovery unit including a frequency detector for recovering a clock, wherein the frequency detector includes: a divider dividing signals among outputs of a voltage controlled oscillator of the plurality of stages according to a rate of the received data; a serial data delayer for delaying the serial data delayed by a delay time of the divider for dividing the output of the voltage controlled oscillator; one or more synchronization detectors comparing an output of the delayer to one of the outputs of the divider to detect synchronization and providing a result of the comparison as a synchronization signal; and a frequency controller which outputs a frequency falling signal by using a periodic pulse signal due to one of the outputs of the divider and the output of the delayer, in a case where a frequency difference occurs, and blocks the frequency falling signal in a case where the frequency is synchronized by the synchronization signal of the synchronization detector and the output of the delayer.

According to another aspect of the present invention, there is provided a serial receiver including a clock recovery unit including a linear phase detector for recovering a clock, wherein the linear phase detector includes: a delayer for delaying initial stage and final stage output signals from among the outputs of the voltage controlled oscillator of the plurality of the stages and the received data; a rising edge detector for detecting a rising edge of the serial data by sampling the serial received data according to the initial stage and the final stage output signals; and a phase detector receiving the received data delayed by the delayer, an output of the rising edge detector, the initial stage and the final stage output of the voltage controlled oscillator delayed by the delayer as inputs, and based on the rising edge of the delayed serial data, outputting a pulse between rising edges of the delayed final stage output and the initial stage output of the voltage controlled oscillator as a signal for adjusting a voltage to be applied to the voltage controlled oscillator.

According to another aspect of the present invention, there is provided a communication method used in a serial transceiver including: a transmitting step of, in a case where the transmitter and the receiver are connected through a serial channel, dividing practical data into a plurality of uniform sizes to insert DC balancing information into every divided area, and inserting start and end information into the entire data to encode and perform serial transmission on practical transmission data having redundant information through the serial channel, by the transmitter, and a receiving step of generating a clock signal corresponding to a data transmission rate trough a frequency detection manner by using the practical transmission data received through the serial channel, recovering a clock by controlling a phase of the clock synchronized in a linear phase detection manner, acquiring data from the practical transmission data serially received, and decoding and outputting the data as original data without the redundant information, by the receiver.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Exemplary embodiments of the present invention will now be described in detail with reference to the accompanying drawings.

Figure 1:
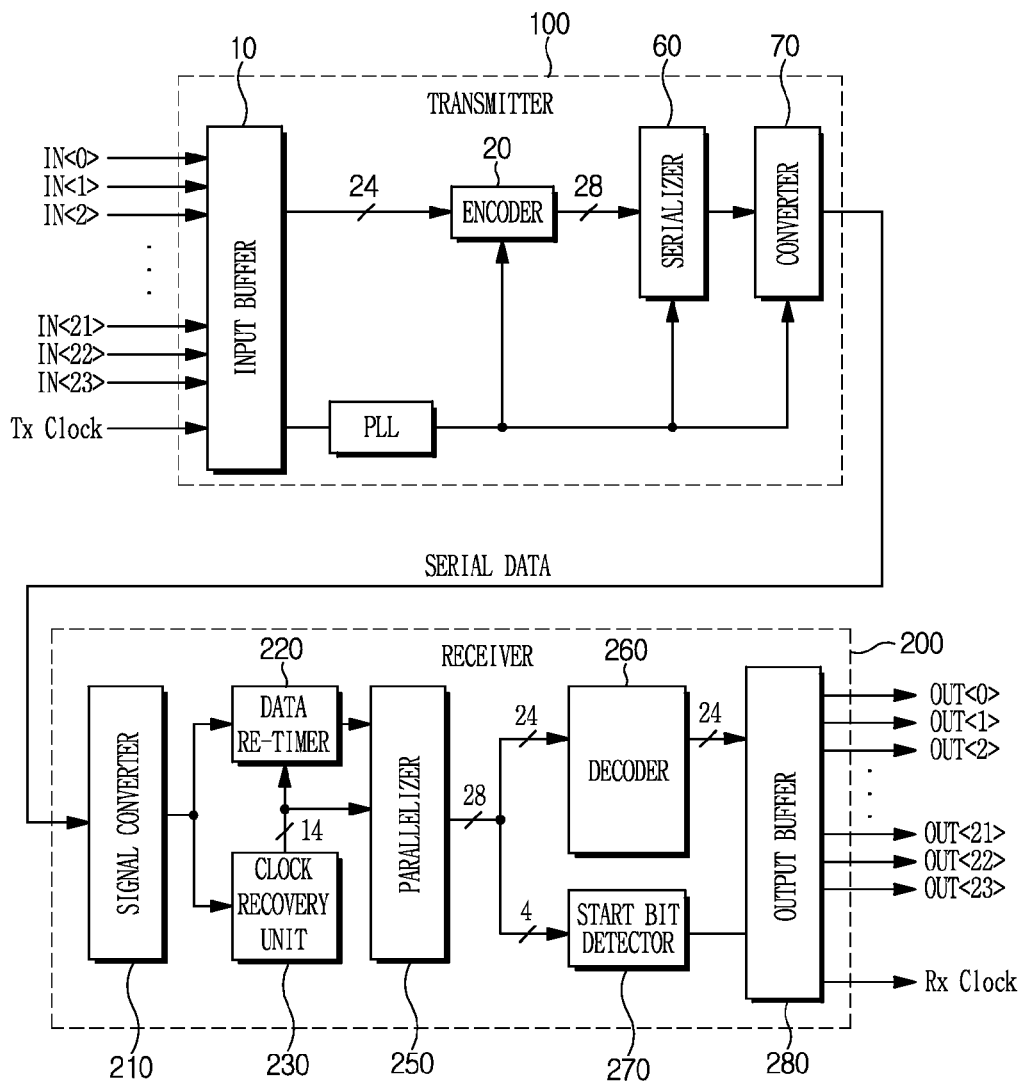
FIG. 1 is a block diagram illustrating a construction of a high speed transceiver without using a reference clock.

FIG. 1 is a block diagram illustrating a construction of a transceiver according to an embodiment of the present invention. The transceiver includes a transmitter 100 for receiving a parallel signal and transmitting the parallel signal as a serial signal and a receiver 200 for receiving the corresponding serial signal. According to the illustrated embodiment, the parallel data to be transmitted is 24-bit parallel data and used for a control signal interface for controlling a liquid crystal display unit.

The transmitter 100 receives the 24-bit parallel data and a reference clock signal and generates parallel data to be generated as a serial signal according to a predetermined protocol through an encoder 20 of FIG. 1. According to the embodiment, the encoder 20 divides 24-bit data into two 12-bit data, inserts a 2-bit direct-current (DC) balancing signal into the divided region, and inserts a start bit and a stop bit for informing of a start and a stop of data. Otherwise, as needed, the encoder 20 may generate a signal having a predetermined pattern.

Figure 2:
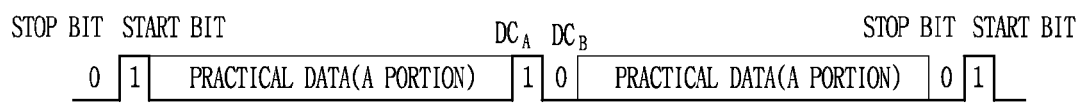
FIG. 2 is a view illustrating a signal transmission type of the high speed transceiver.

In a case where the encoded parallel signal is converted into the serial signal, the serial signal may have a structure as illustrated in FIG. 2. Here, the 1 start bit and the 1 stop bit exist, the parallel data to be transmitted is divided into blocks (in FIG. 2, two 12-bit blocks) having the same size, and a pair of DC balancing signals $DC_A$ and $DC_B$ are inserted into the divided area. Specifically, as illustrated in FIG. 2, the converted 28-bit signal has a start bit for representing a value of 1 to inform of a start of data and a stop bit for representing a value of 0 to inform of an end of the data as a code inserted to apply frequency information to the data and has the DC balancing bits in the middle of 24-bit practical data. Since the start bit and the stop bit have the values of 1 and 0, respectively, when the first bit output and the last bit output of the receiver always have values of 1 and 0, respectively, this has a function of determining that the receiver 200 finishes a recovery operation. In addition, the DC balancing bits $DC_A$ and $DC_B$ have a function of DC balancing to minimize data deterioration due to long distance transmission.

The data generated by the encoder 20 is transmitted as encoded serial transmission data through a serializer 60 and a converter 70 for converting logic signals such as a complementary metal-oxide-semiconductor (CMOS) and the like into low voltage differential signaling (LVDS) signals in serial communication channels. First, when power is applied to the transmitter 100 and the receiver 200, the converter 70 in the transmitter 100 outputs only a signal of 0 until a phase locked loop (PLL) in the transmitter 100 is in synchronization with a reference clock. Here, the receiver 200 starts an internal initializing operation and maintains the entire circuit in the receiver in a reset state. When the PLL in the transmitter 100 is in synchronization with the external reference clock, the transmitter 100 transmits data through an encoding operation, and the receiver 200 generates a clock signal according to a data rate of the transmitted data and controls a phase of the clock so that the transmitted data can be sampled at an optimal position.

In the receiver 200, a signal is acquired in a data block unit divided according to a clock converted by a signal converter 210 for converting the LVDS signal (the serial data) received through the serial channel back into the logic level signal and recovered by a clock recovery unit 230 for clock recovery and a data re-timer 220 and parallelized through the parallelizer 250. Thereafter, a start bit detector 270 detects a fine lock by using redundant bits, a decoder 260 acquires a 24-bit signal that has practical data, and data OUT<0> to OUT<23> having the originally transmitted parallel signal type, a reception clock Rx Clock, and a lock signal DE are output through an output buffer 280.

Figure 3:
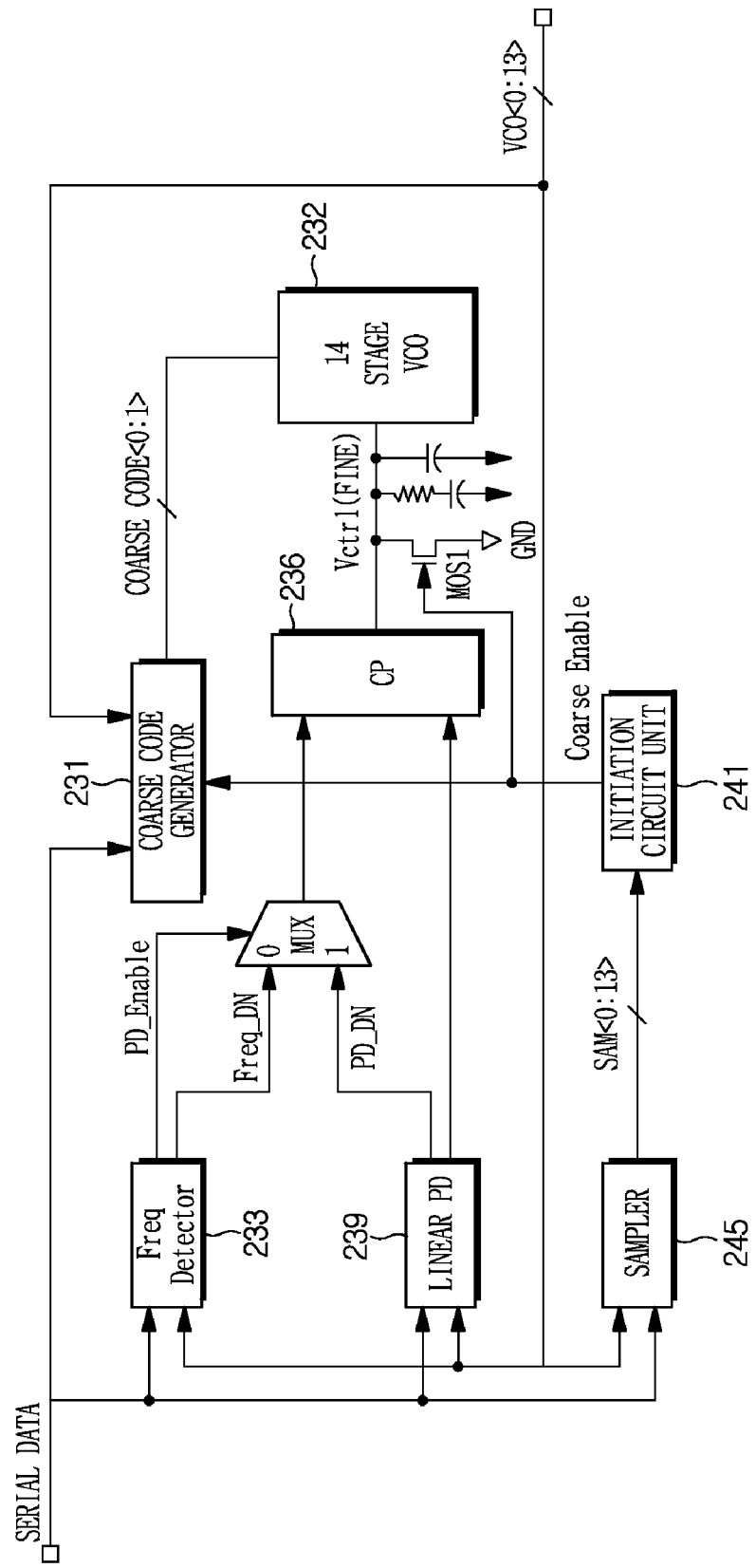
FIG. 3 is a block diagram illustrating a construction of a clock recovery circuit.

FIG. 3 is a block diagram illustrating the clock recovery unit 230 according to the embodiment of the present invention.

By using jitter characteristics inversely proportional to a signal speed, for example, when the transmitter transmits a signal by applying 28-bit data information to a clock signal of from 5 to 65 MHz, the receiver is designed to extract 14-bit data information from every clock signal of from 10 to 130 MHz, so that jitter of the clock in the receiver can be reduced. Specifically, data is extracted according to a size of the data block divided during encoding such that a jitter reducing operation is performed in the receiver.

Operations of the illustrated circuit are classified into three steps including a coarse voltage generation operation, a PLL synchronization operation, and a data sorting operation. The coarse voltage generation operations is related to low jitter characteristics of a broadband transceiver and enables the PLL in the receiver to divide the entire frequency range into a plurality of (for example, three) frequency ranges instead of controlling a wide frequency range (for example, from 10 to 130 MHz) as a single fine adjusting rage and control only a frequency band corresponding to a coarse voltage having predetermined bits (for example, 2 bits in a case where three or less ranges are used) as a fine adjusting voltage, so that a gain of a voltage controlled oscillator 232 can be minimized. As the gain of the voltage controlled oscillator 232 is higher, a frequency change is increased even though change in the adjusting voltage is small, and the frequency change is very sensitive to external noise, so that jitter characteristics are degraded. Therefore, the control method of selecting an operation frequency band using a coarse voltage has been conventionally used, however, in this method, an external coarse voltage corresponding to a frequency band has to be directly applied, so that an additional external control signal is necessary. However, according to the embodiment, the receiver 200 is improved to include a coarse code generator 231 for generating a coarse voltage corresponding to an operation speed, so that an additional control signal is not needed.

A coarse voltage operation of the coarse code generator 231 is performed as follows. When initial power is applied to the transceiver, the PLL in the transmitter is operated to be in synchronization with a reference clock signal. In this case, a serial channel output of the transmitter 100 is set to 0 until the PLL is synchronized. Accordingly, the receiver 200 can receive the input of 0 until the transmitter 100 can normally operate.

Here, the serializer 60 in the transmitter 100 performs sampling on the serial data signal by using a clock signal generated by vibrating the PLL in the receiver 100. Since the serial data signal is fixed to 0, the sampled 14-bit signal is also fixed to 0. When the PLL in the transmitter 100 finishes the synchronization operation, the data signal encoded as described above is transmitted as an output of the transmitter, that is, serial data to the receiver 200. If the serial data has another value instead of 0, a sampler 245 in the receiver 200 has at least an output among the 14-bit output as 1.

Figure 4:
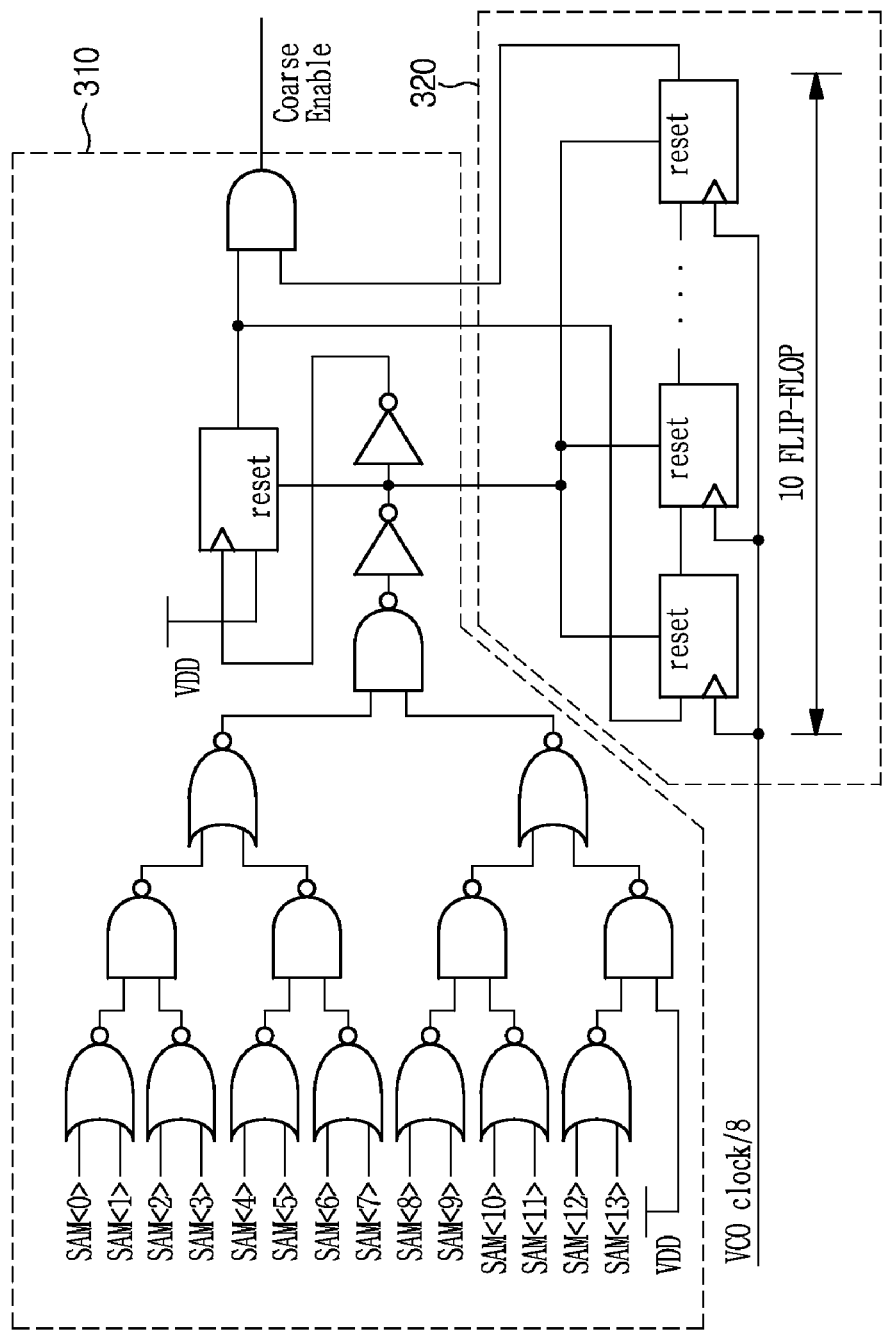
FIG. 4 is a block diagram illustrating a construction of an initiation circuit unit.

FIG. 4 illustrates a construction of an initiation circuit unit 241 included in the clock recovery unit 230. The initiation circuit unit 241 is constructed with a simple circuit 310 including NOR gates, NAND gates, inverters, and the like to distinguish a case where all 14-bit parallelizer outputs are 0 from a case where at least one of the outputs is 1 and allow the receiver 200 to determine whether or not the transmitter 100 finishes the internal synchronization operation and provides a signal. When the determination circuit 310 including the NOR gates, the NAND gates, and the inverters in the initiation circuit unit 241 determines that at least one of the parallelizer outputs is 1, 10 D flip-flops 320 connected to an end of the determination circuit 310 generate a long pulse signal having 80 periods through a clock signal divided by 8. This pulse signal serves as a coarse enable signal that is the final output of a start circuit to reset the entire receiver 200 and starts a coarse voltage generation operation. Here, a circuit and method of generating the long pulse having 80 periods are used to obtain a predetermined delay for initial synchronization of the receiver 200, and a detailed construction thereof and a time of the delay may be modified.

Figure 5:
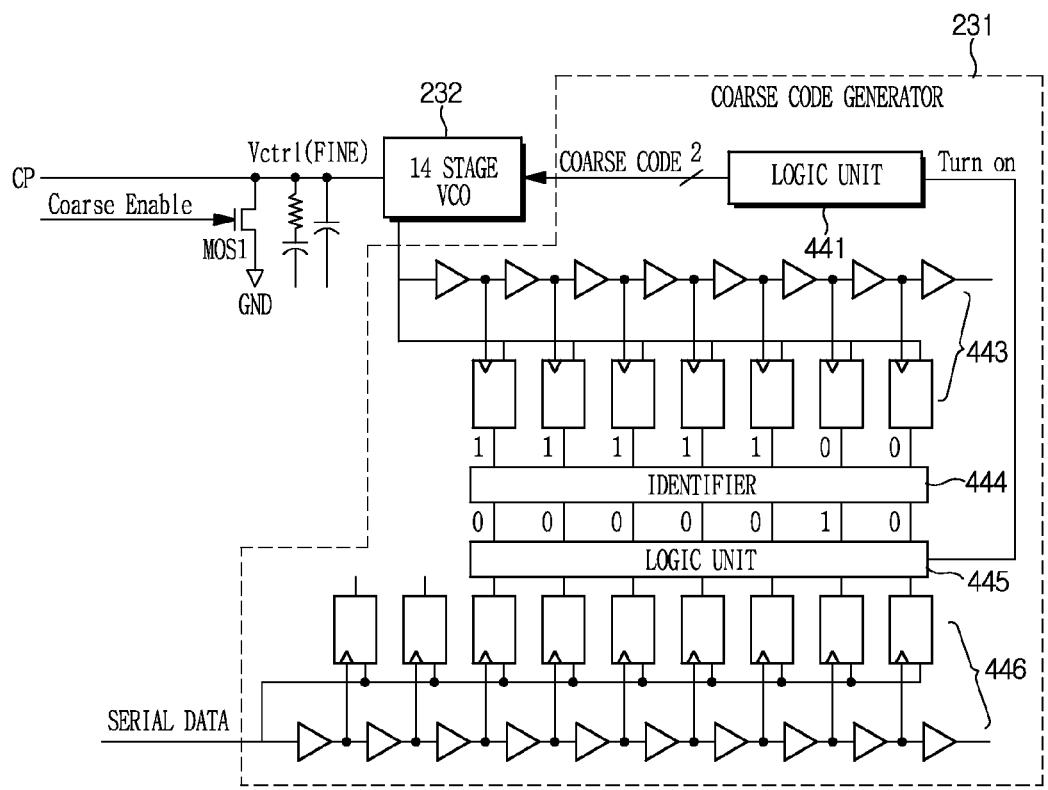
FIG. 5 is a block diagram illustrating a construction of a coarse voltage generator.
Figure 6:
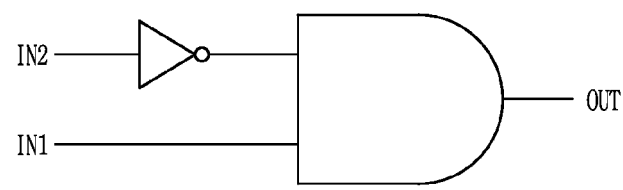
FIG. 6 is a block diagram illustrating a construction of a 1-0 detector included in the coarse voltage generator.

The coarse code generation operation is performed by the coarse code generator 231 illustrated in FIG. 5. The coarse enable signal is connected to a MOS1 so as to enable a control voltage Vctrl to be connected to a supply voltage VDD or a ground voltage GND (GND in FIG. 5) while the coarse enable signal has the value of 1 and enable the voltage controlled oscillator 232 to oscillate at the maximum speed of the current coarse code. Since the entire circuit in the receiver 200 has finished a reset operation by the start circuit 241, the initial coarse code has a state of 00, and the voltage controlled oscillator 232 is in a state of oscillating at the maximum frequency in the lowest frequency range according to the current coarse code. The coarse code generator 231 receives a clock signal of the voltage controlled oscillator 232 oscillating at the maximum frequency according to the current coarse code and a serial data signal applied in a form of the reference clock signal and applies the received signals to delay stages including inverters and D flip-flop stages 443. The D flip-flop stages connected to the delay stages output 1 when a clock signal delayed by sampling an input clock signal at a rising edge of the delayed clock signal has a phase prior to a falling edge of the input clock signal and output 0 when the delayed clock signal has a phase later than the falling edge so that the output value is changed from 1 to 0 at a portion where the falling edge of the input clock signal and the rising edge of the delayed clock have similar phases. This has a function of determining the number of delay cells that a signal passes, the signal having a similar phase to the falling edge of the clock signal. An identifier (referred to as 1-0 identifier) 444 is a block formed by arraying circuits illustrated in FIG. 6. Since the circuit outputs a signal of 1 at a point where the input signal is changed from 1 to 0, a signal of 1 is generated at a stage corresponding to a position of the falling edge of the clock signal. If the identifier 444 outputs the signal of 1 at an N-th stage through the aforementioned operation, it can be seen that a period of the input signal has a value similar to 2N.

Therefore, by detecting an order of a stage of the identifier 444 outputting the value of 1, a faster signal can be easily detected. When it is determined that the serial data signal is faster than the clock signal of the voltage controlled oscillator 232 by the means of the aforementioned operation, the coarse code is increased by 1 by logic units 445 and 441 including simple digital logics. As the coarse code is increased, by comparing the clock signal of the voltage controlled oscillator 232 oscillating at the one step higher range to the serial data signal, the coarse code is increased by 1, or an operation for maintaining the current value is repeated.

Figure 7:
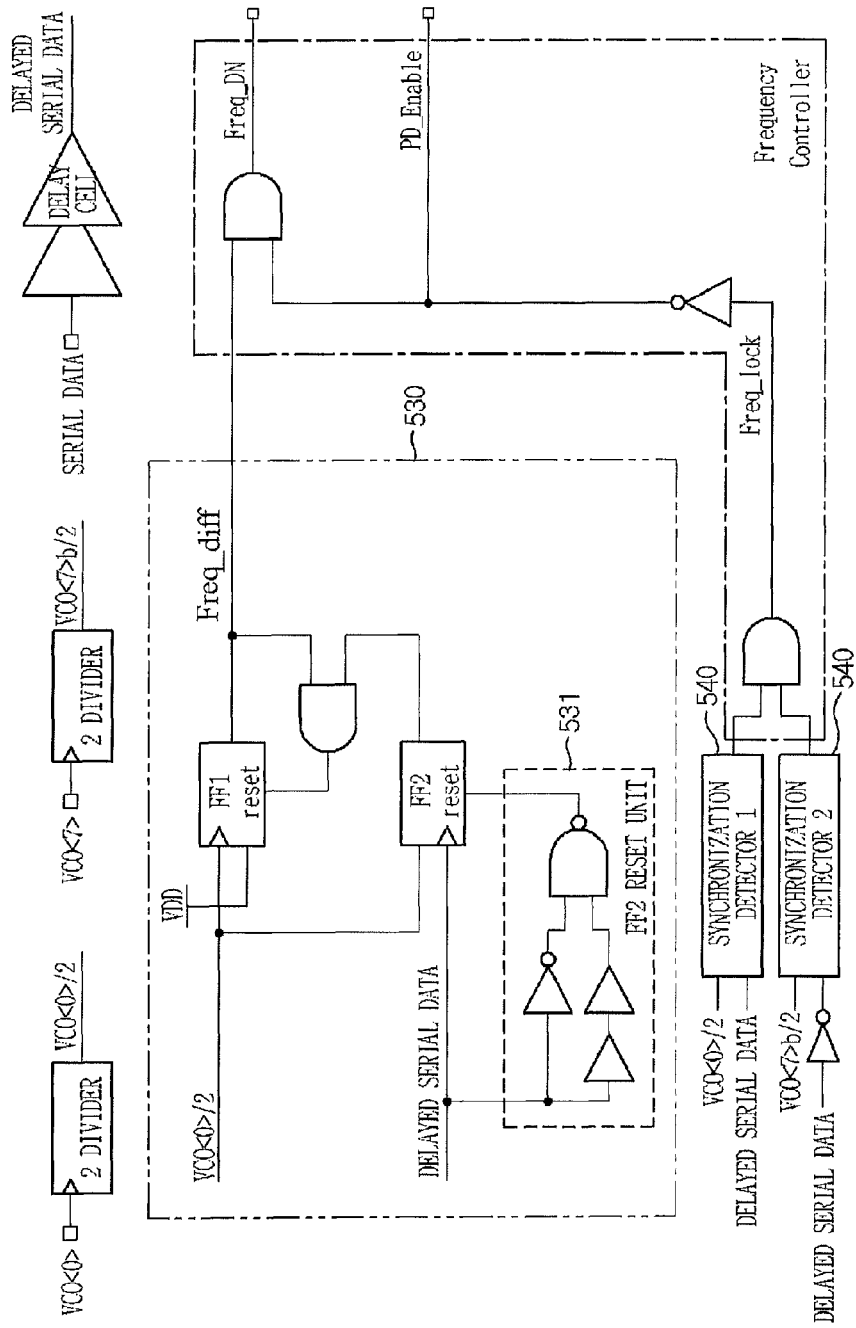
FIG. 7 is a block diagram illustrating a construction of a frequency detector circuit.

After the 80 periods of the reference clock signal, the value of the coarse enable signal is changed to 0. When the coarse enable signal has the value of 0, the MOS1 for connecting the control voltage Vctrl to the ground voltage GND to perform the coarse code generation operation is turned off, and the generated coarse code is maintained. Here, the clock recovery circuit has a type of a frequency locked loop including the voltage controlled oscillator 232, a frequency detector 233, a charge pump 236, and a loop filter (including a resistor and a capacitor). A frequency locked loop synchronization operation is an operation of synchronizing an output clock of the voltage controlled oscillator 232 with the serial data applied through the frequency locked loop. The frequency detector 233 illustrated in FIG. 7 has a function of decreasing a frequency of the voltage controlled oscillator 232 that oscillates at the maximum frequency in the current frequency range by the coarse code generation operation down to a range corresponding to the data rate. According to the embodiment, since the voltage controlled oscillator oscillates at the speed twice the data rate, the clock signal VCO<0>/2 divided by 2 as illustrated in FIG. 7 is compared with a serial data signal delayed for a delay time of a 2 divider. The D flip-flops FF1 and FF2 in a frequency comparator 530 generate signals of 1 at the rising edges of the clock signal VCO<0>/2 and the delayed serial data signal, respectively, the flip-flop FF1 is reset when the signals of the two flip-flops are 1, and the flip-flop FF2 is reset at every falling edge of the serial data delayed by the operation of an FF2 reset unit. Since a period of the VCO<0>/2 includes 28-bit data, the delayed serial data signal has a larger number of rising edges than the VCO<0>/2. In this case, when all of the rising edges of the delayed serial data generate 1, an accurate frequency cannot be easily extracted. Therefore, the flip-flop FF1 receives the VDD signal as data of the flip-flop to generate 1 at every rising edge of the VCO<0>/2, and the flip-flop FF2 receives the VCO<0>/2 as data of the flip flop to generate 1 only at the rising edge of the delayed serial data generated after the rising edge of the VCO<0>/2 (a section where the VCO<0>/2 is 1), so that a phase difference with the rising edge of the delayed serial data that occurs first after the rising edge of the VCO<0>/2 can be detected. After a signal Freq_diff representing a frequency difference has a value of 1 at the rising edge of the VCO<0>/2, the value of the signal is changed to 0 as the flip-flop FF1 is reset at the rising edge of the delayed serial data that occurs next, so that the signal has a pulse width corresponding to the phase difference between the VCO<0>/2 and the delayed serial data, and this signal is transmitted to the charge pump 236 to decrease the frequency until a signal PD_Enable representing frequency synchronization occurs. A time delay between the rising edge of the VCO<0>/2 and the rising edge of the delayed serial data signal is continuously in a predetermined range (a lock range designated by a synchronization detector), the synchronization detector generates a lock signal Freq_lock.

Figure 8:
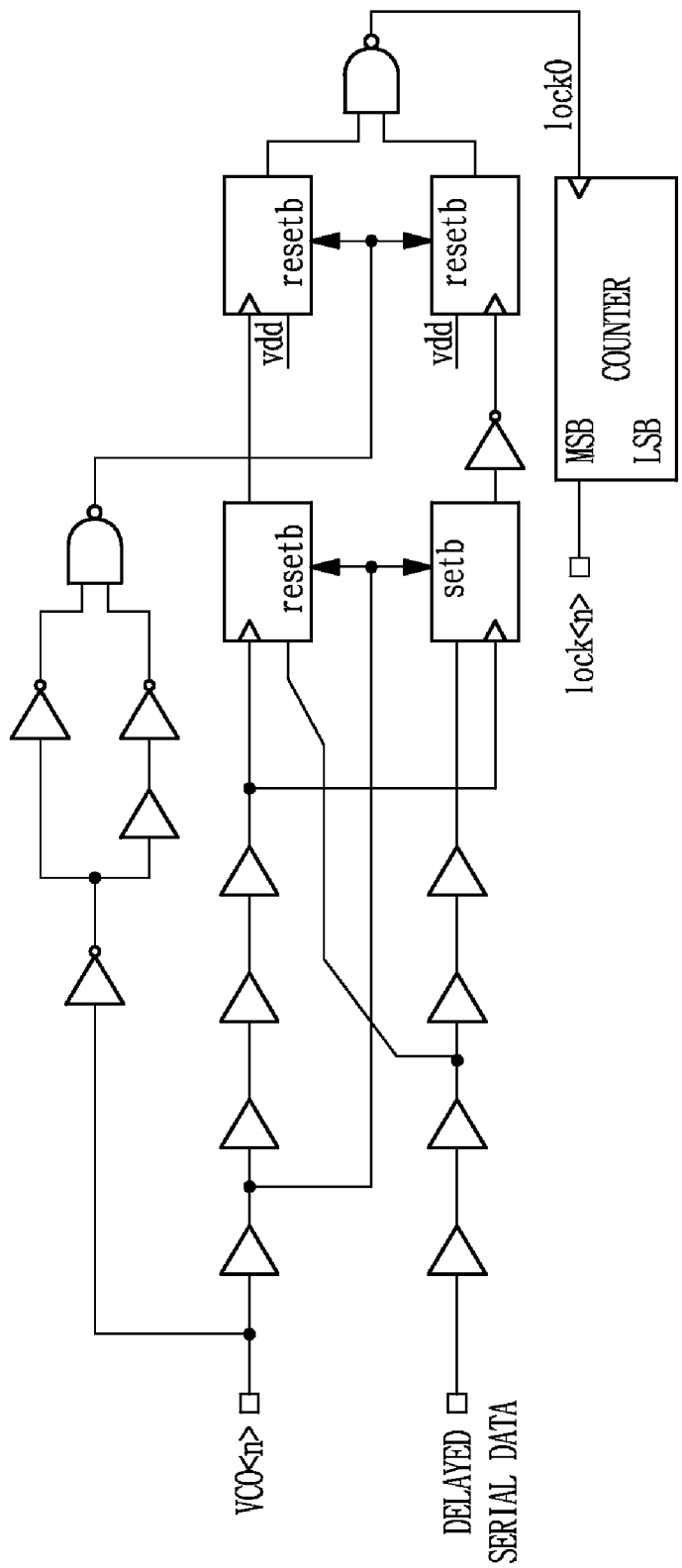
FIG. 8 is a block diagram illustrating a construction of a synchronization detector applied to the frequency detector circuit.

The synchronization detector 540 illustrated in FIG. 8 receives the serial data and the output clock of the voltage controlled oscillator 232 during the frequency locked loop synchronization operation, and when a phase difference between the two signals is smaller than a delay time of a buffer cell of an input terminal of the D flip-flop, the synchronization detector 540 determines that the two signals are in synchronization with each other and outputs a signal lock0 as 1. A counter connected to the signal lock0 has a function of outputting a final output lock<n> as 1 only when the lock signal is output as 1 for 8 or more periods (according to the embodiment) in preparation for errors of the synchronization detector 540.

The delayed serial data includes arbitrary signals excluding the start/stop bits and the DC balancing bits $DC_A/DC_B$, so that a lock condition of the synchronization detector 540 cannot be satisfied until the rising edge of the delayed serial data that occurs right after the VCO<0>/2 becomes the rising edge of the start bit. When the synchronization detector 540 does not generate the lock signal, the frequency detector 233 generates a signal Freq_DN for continuously decreasing the frequency, and as a result, in the final lock state, the rising edge of the VCO<0>/2 and the rising edge of the start bit of the delayed serial data exist in the lock range. A synchronization detector 1 has a function of detecting a time delay between the rising edges of the VCO<0>/2 and the start bit of the delayed serial data as described above, and a synchronization detector 2 has a function of detecting a time delay between the falling edges of a VCO<7>b/2 and the $DC_A$ bit that is the fourteenth bit.

When the rate of the serial data and the frequency of the clock are in synchronization with each other and phases of the rising edges of the VCO<0>/2 and the start bit are in synchronization with each other, due to a data structure according to the embodiment, the falling edges of the VCOb<7>/2 and the $DC_A$ bit have to be in synchronization with each other. Therefore, for more accurate synchronization detection, the two synchronization detectors are used, and the number of the synchronization detectors may be changed according to designing. Here, when both of the two synchronization detectors generate the lock signals, a PD_Enable signal is generated, and at the same time, an input of a NAND gate having an output as a signal Freq_DN becomes 0 and the signal Freq_DN is maintained as 0.

When the synchronization signal PD_Enable of the synchronization detector 233 outputs 1, the receiver 200 stops the frequency locked loop synchronization operation and changes an output of a multiple phase selector 234 to form a new loop. The new loop includes the voltage controlled oscillator 232, a linear phase detector 239, and the charge pump CP 236, and a clock of the voltage controlled oscillator 232 generated through the loop and a sorted serial data signal are connected to the parallelizer 250.

The new loop is a loop for a data sorting operation and has a function of arranging the rising edge of the clock of the voltage controlled oscillator 232 to be disposed at the center of each bit of the practical data signal. A conventional high speed transceiver mainly uses a bang-bang phase locked loop to form the clock recovery circuit. However, there are problems in that a recovered clock signal has relatively higher jitter and this increases a bit error ratio (BER). Therefore, according to the embodiment, the linear phase detector 239 is designed to be used to decrease the jitter and the BER.

The voltage controlled oscillator 232 may provide an oscillating output for a 14-bit data block (12-bit data and redundant 2 bits) by using 14 stages, that is, the voltage controlled oscillator having 14 different phases. If an input signal is divided by data blocks having different sizes, different stages are needed.

Figure 9:
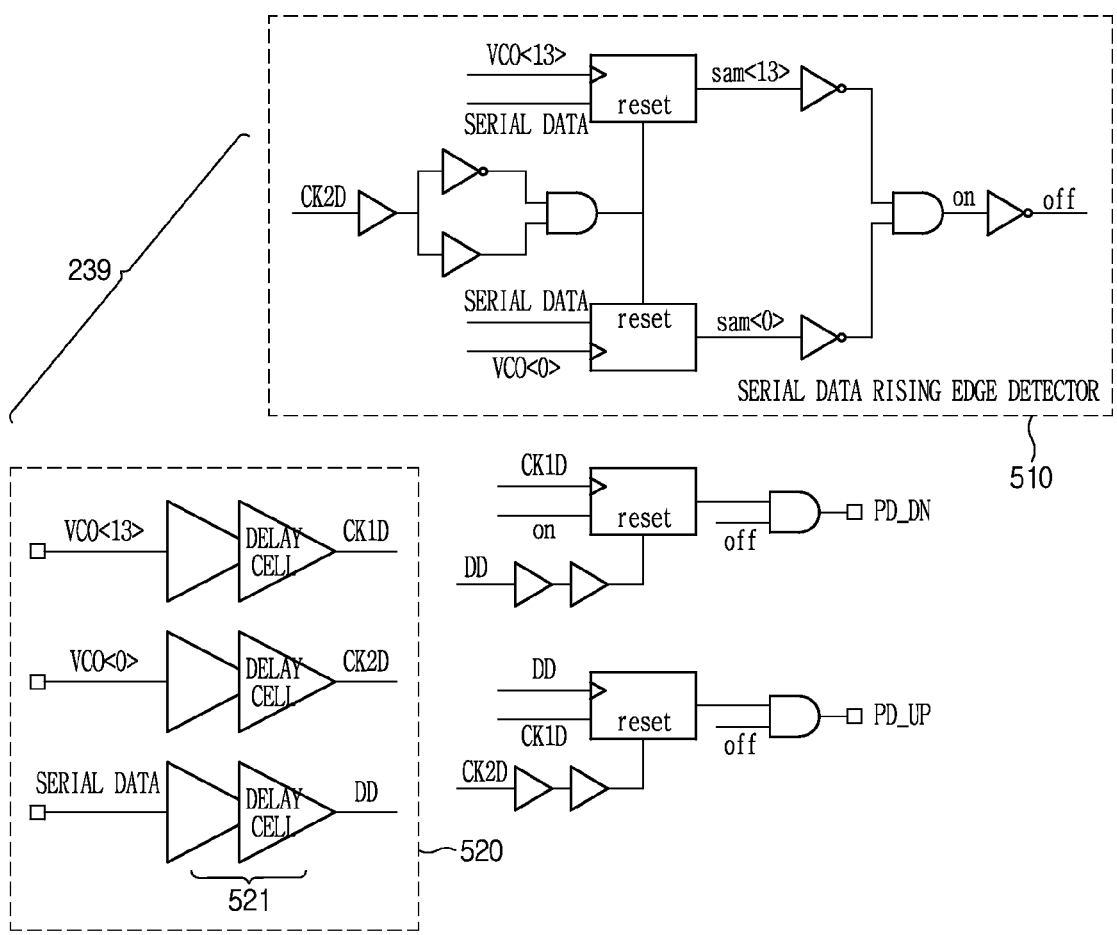
FIG. 9 is a block diagram illustrating a construction of a linear phase detector circuit.
Figure 10:
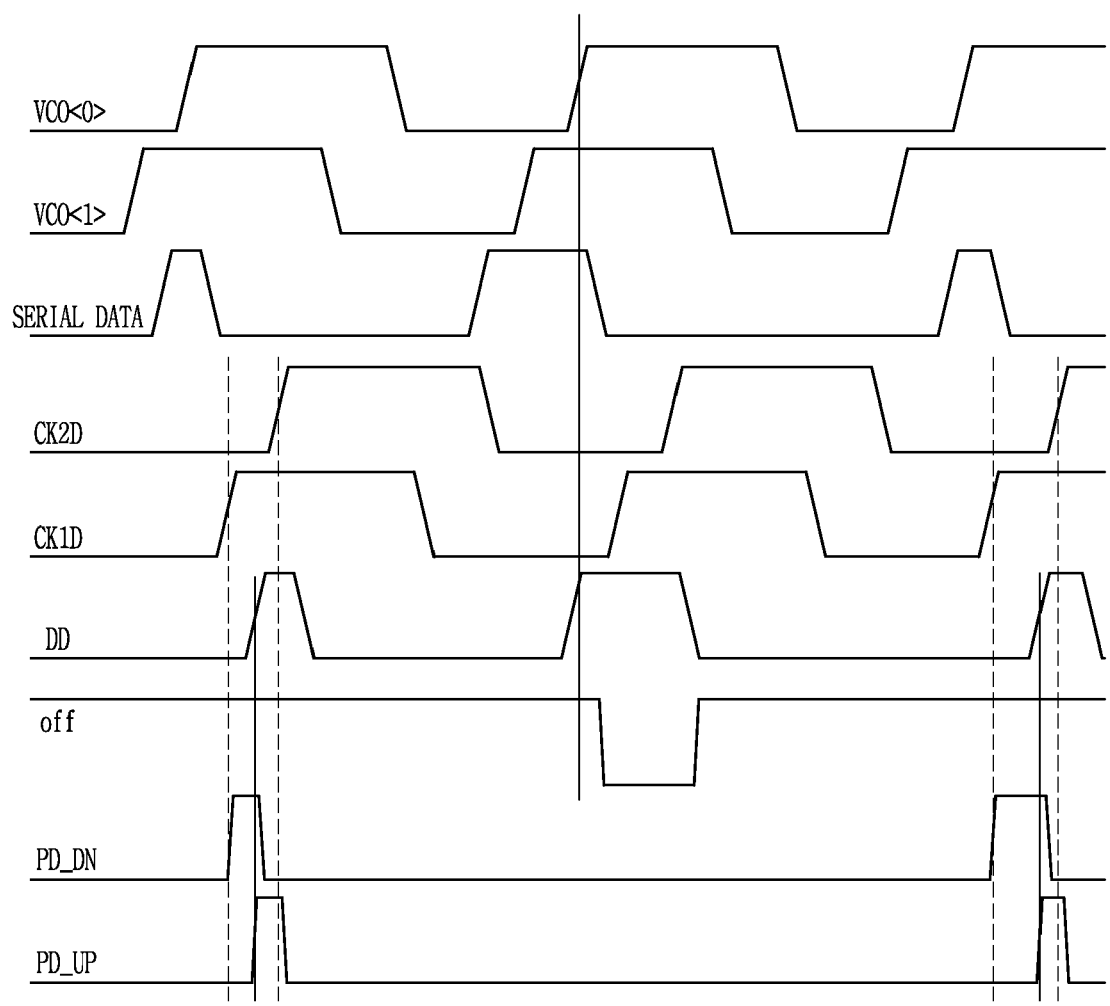
FIG. 10 is a view illustrating a case where a phase difference is detected by the linear phase detector.

FIGS. 9 and 10 are views illustrating an example circuit diagram and operation waveforms of the circuit of the linear phase detector 239. The linear phase detector 239 includes a serial data rising edge detector 510. The serial data rising edge detector 510 receives two multiple phase clock signals VCO<13> and VCO<0> and serial data signals, and when output signals sam<13> and sam<0> obtained by sampling the serial data using the clock signals have values of 0 and 1, respectively, in other words, when the serial data signal has a rising edge, the serial data rising edge detector 510 outputs a pulse signal corresponding to a phase difference between the clock signal and the serial data signal. In this case, operations of the serial data rising edge detector 510 for determining whether or not the rising edge of the serial data exists have to be finished before signals PD_DN and PD_UP are generated. However, the signal sam<0> that is a result of sampling the serial data by using the VCO<0> signal that is generated after a data bit from the VCO<13> is generated after the PD_DN is generated by the VCO<13>. In order to solve the aforementioned problems, the three input signals VCO<13>, VCO<0>, and the serial data are connected to the delay cell 521 having a delay more than a data bit, and the detection of the signals PD_DN and PD_UP is performed by using signals CK1D, CK2D, and DD obtained by delaying the signals. For example, in a case where 13-th and 0-th multiple phase clock signals are used from among 14 multiple phases, if the serial data signal sampled by the 13-th clock signal and the serial data signal sampled by the 0-th clock signal have values of 0 and 1, respectively, that is, if the rising edge of the serial data signal is between the 13-th and 0-th clock signals as illustrated in FIG. 10, the linear phase detector 239 represents a phase difference between the rising edge of the delayed 13-th clock signal CK1D and the rising edge of the delayed serial data DD as the PD_DN signal, and represents a phase difference between the rising edge of the DD and the rising edge of the delayed 0-th clock signal CK2D as the PD_UP signal. Since the signals PD_DN and PD_UP are represented as pulses proportional to the phase difference between the multiple phase clock signal and the serial data signal, in a case where the signal PD_DN has a pulse wider than the signal PD_UP, a signal is transmitted to the charge pump 236 to allow the multiple clock signal to be slower. In the opposite case, a signal is transmitted to the charge pump 236 to allow the multiple clock signals to be faster. In a case where the signals PD_DN and PD_UP have the same width, it means that the 0-th clock is disposed at the center of the serial data. Therefore, in this case, output current of the charge pump 236 is maintained.

Since the signals PD_DN and PD_UP are signals input to the charge pump, in a case where a phase difference between the two signals exists, current errors may occur in the charge pump and phase locked error may occur. Therefore, the signal PD_DN that is output first is output to be delayed for a delay of a stage of a delay cell, that is, a phase that is half the phase difference between the multiple phase clock signals so as to minimize locked phase errors.

After the data sorting using the linear phase detector 239, the first output and the last output of the parallelizer 250 are fixed to 1 and 0 representing the start bit and the stop bit, respectively. When the start bit detector 270 that is a circuit having a simple logic for detecting whether or not the first output and the last output are output as 1 and 0, respectively, checks that the start bit and the stop bit are fixed to 1 and 0, respectively, the start bit detector 270 provides an enabling signal for fixing the DE signal that is the final lock signal to 1 and enabling the output of the parallelizer 250 to be used. Finally, the receiver 200 outputs a practical 24-bit output excluding the start bit, the stop bit, DCA, and DCB from the 28-bit output signal and the clock signal synchronized with the data rate.

The serial transceiver and the communication method according to the embodiment of the present invention apply the clock recovery unit including the coarse code generator, the frequency detector, and the linear phase detector to the receiver. Therefore, while the embedded clock method of applying clock information to data is used, problems such as skew between the reference clock and data that may occur during data transmission and jitter of the recovered clock can be solved.

The serial transceiver and the communication method used by the serial transceiver according to the embodiment of the present invention do not transmit the reference clock while transmits data. Therefore, skew between the data and the reference clock can be removed, and the number of transmission channels can be minimized, so that hardware costs can be reduced.

The serial transceiver and the communication method used by the serial transceiver according to the embodiment of the present invention can control speed of the serial communications using a single channel without additional external operations and significantly reduce jitter of the recovered clock signal by applying the linear phase detection method, thereby increasing the maximum communication speed and stability.

The serial transceiver and the communication method used by the serial transceiver according to the embodiment of the present invention do not need an initial synchronization operation between the transmitter and the receiver although the embedded clock method is used, so that operations and the construction of the transceiver are simple. In addition, clock recovery reliability of the receiver is high, so that the construction for connecting the transmitter and the receiver can be simplified with low costs.

What is claimed is:

1. A serial transceiver, comprising:
a transmitter which receives parallel data to be transmitted to encode the received parallel data as transmission data including DC (direct current) balancing information and includes a serial transmission unit for performing serial transmission on data encoded according to a communication clock of an internal PLL (phase locked loop) operating based on an externally provided clock; and
a receiver which includes a clock recovery unit including a frequency detector and a linear phase detector for receiving the encoded data from the transmitter and performing sequential synchronization by using the received encoded data and an output of a voltage controlled oscillator, a parallelizer for converting the received serial data into parallel data by using clocks of a plurality of stages generated by the voltage controller oscillator from the clock recovery unit, a start bit detector for detecting a start bit by comparing data in the output of the parallelizer through a logic circuit, and a decoder for decoding and outputting the output of the parallelizer,
wherein the frequency detector comprises:
a divider dividing, during a delay time, each clock of the plurality of stages generated by the voltage controlled oscillator according to a rate of the received data and outputting the divided signals;
a serial data delayer for delaying the serial data by the amount of said delay time, and outputting a signal of the delayed serial data;
one or more synchronization detectors comparing an output of the delayer to one of the outputs of the divider to detect synchronization and providing a result of the comparison as a synchronization signal; and
a frequency controller which outputs a frequency down signal to continuously decrease the frequency of a periodic pulse signal, which is the output of the divider, when the output of the delayer and the periodic pulse signal are different,
wherein the frequency controller generates and maintains the frequency down signal to be "0", in a case when two synchronization detectors are used, both of the two synchronization detectors detect a lock condition,
wherein the lock condition is detected when the frequency of the output of the delayer and the frequency of the periodic pulse signal are in synchronization with each other.

2. The serial transceiver of claim 1, wherein the transmitter includes an encoding unit which receives a plurality of parallel data signals to divide a corresponding parallel data signal into two or more units, inserts information for DC balancing into the divided position, and inserts start information and end information into start and end portions of the entire data.

3. The serial transceiver of claim 1, wherein the clock recovery unit of the receiver includes:
the voltage controlled oscillator of the plurality of stages in which a frequency range is determined by a coarse code;
an internal coarse code generator receiving an output of the voltage controlled oscillator and the received serial data as inputs to provide the coarse code for controlling the voltage controlled oscillator to the voltage controlled oscillator;
the frequency detector receiving the voltage controlled oscillator output in the frequency range determined by the output of the coarse code generator and the received parallel data as inputs to output a signal for controlling a voltage applied to the voltage controlled oscillator for frequency synchronization;
the linear phase detector receiving the voltage controlled oscillator output and the received parallel data as inputs in a case where the frequency synchronization is performed by the frequency detector to output a signal for controlling the voltage applied to the voltage controlled oscillator for phase synchronization; and
a charge pump selectively receiving the output from the frequency detector and the linear phase detector to control the voltage applied to the voltage controlled oscillator.

4. The serial transceiver of claim 3, wherein the clock recovery unit further includes:
a sampler for sampling the received serial data by using the output of the voltage controlled oscillator; and
an initiation circuit unit for generating and providing a coarse enable signal for determining whether or not the coarse code generator is to operate according to the output of the sampler to the coarse code generator.

5. The serial transceiver of claim 4,
wherein the charge pump further includes a switch for selectively connecting the voltage applied to the voltage controlled oscillator to a maximum voltage or a minimum voltage to allow the voltage controlled oscillator to operate at a maximum frequency, and
wherein the coarse enable signal is used as a control signal for operating the switch.

6. The serial transceiver of claim 3, wherein the voltage controlled oscillator of the plurality of the stages has a stage having the same size as a value obtained by adding bits of a data block divided by the inserted DC balancing information from among the serial signals provided for a signal external clock and the half the inserted DC balancing information and a start or a stop bit.

7. A serial receiver which is connected to a transmitter that encodes and transmits parallel data as serial data, in order to receive the serial data, recovers a clock included in the serial data, and converts and decodes the serial data into parallel data to output the received clock and the decoded parallel data, the serial receiver comprising:
- a clock recovery unit including a frequency detector and a linear phase detector for receiving the serial data from the transmitter and performing sequential synchronization by using the received serial data and an output of a voltage controlled oscillator;
- a parallelizer for converting the received serial data into parallel data by using clocks of a plurality of stages generated by the voltage controller oscillator from the clock recovery unit;
- a start bit detector for detecting a start bit by comparing data in the output of the parallelizer through a logic circuit; and
- a decoder for decoding and outputting the output of the parallelizer wherein the frequency detector comprises:
- a divider dividing, during a delay time, each clock of the plurality of stages generated by the voltage controlled oscillator according to a rate of the received data and outputting the divided signals;
- a serial data delayer for delaying the serial data delayed by the amount of said delay time, and outputting a signal of the delayed serial data;
- one or more synchronization detectors comparing an output of the delayer to one of the outputs of the divider to detect synchronization and providing a result of the comparison as a synchronization signal; and
- a frequency controller which outputs a frequency down signal to continuously decrease the frequency of a periodic pulse signal, which is the output of the divider, when the output of the delayer and the periodic pulse signal are different, wherein the frequency controller generates and maintains the frequency down signal to be "0", in a case when two synchronization detectors are used, both of the two synchronization detectors detect a lock condition, wherein the lock condition is detected when the frequency of the output of the delayer and the frequency of the periodic pulse signal are in synchronization with each other.

8. The serial receiver of claim 7, wherein the clock recovery unit includes:
- the voltage controlled oscillator of the plurality of stages in which a frequency range is determined by a coarse code;
- an internal coarse code generator receiving an output of the voltage controlled oscillator and the received serial data as inputs to provide the coarse code for controlling the voltage controlled oscillator to the voltage controlled oscillator;
- the frequency detector receiving the voltage controlled oscillator output in the frequency range determined by the output of the coarse code generator and the received parallel data as inputs to output a signal for controlling a voltage applied to the voltage controlled oscillator for frequency synchronization;
- the linear phase detector receiving the voltage controlled oscillator output and the received parallel data as inputs in a case where the frequency synchronization is performed by the frequency detector to output a signal for controlling the voltage applied to the voltage controlled oscillator for phase synchronization; and
- a charge pump selectively receiving the output from the frequency detector and the linear phase detector to control the voltage applied to the voltage controlled oscillator.

* * * * *